United States Patent
Heo et al.

(10) Patent No.: US 11,329,570 B1
(45) Date of Patent: May 10, 2022

(54) LARGE-CAPACITY BIDIRECTIONAL ISOLATED DC-DC CONVERTER ASSEMBLY AND COOLING STRUCTURE THEREOF

(71) Applicant: HYUNDAI MOBIS Co., Ltd., Seoul (KR)

(72) Inventors: Min Heo, Seongnam-si (KR); Ji Hoon Park, Suwon-si (KR); Du Ho Kim, Yongin-si (KR); Soo Min Jeon, Giheung-gu (KR); Deok Kwan Choi, Yongin-si (KR); Won Gon Kim, Yongin-si (KR); Kang Min Kim, Seoul (KR); A Ra Lee, Seongnam-si (KR); Tae Ho Bang, Seoul (KR); Hyun Woo Shim, Suwon-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 0 days.

(21) Appl. No.: 17/135,811

(22) Filed: Dec. 28, 2020

(30) Foreign Application Priority Data

Dec. 21, 2020 (KR) ........................ 10-2020-0179563

(51) Int. Cl.
*H02M 3/335* (2006.01)
*H02M 1/44* (2007.01)
*H05K 7/20* (2006.01)
*H02M 7/00* (2006.01)
*H02M 1/00* (2006.01)

(52) U.S. Cl.
CPC ......... *H02M 3/33584* (2013.01); *H02M 1/44* (2013.01); *H02M 7/003* (2013.01); *H05K 7/20927* (2013.01); *H02M 1/0009* (2021.05)

(58) Field of Classification Search
CPC .... H02M 3/33584; H02M 1/44; H02M 7/003; H02M 1/0009; H05K 7/20927
See application file for complete search history.

(56) References Cited

U.S. PATENT DOCUMENTS

| 8,576,528 B2* | 11/2013 | Nagano .................. H02M 1/34 |
| | | 361/91.7 |
| 10,199,555 B2 | 2/2019 | Chaput |
| 10,468,885 B2* | 11/2019 | Wagoner .................. H02J 3/32 |

(Continued)

FOREIGN PATENT DOCUMENTS

| JP | 2006-034006 A | 2/2006 |
| KR | 10-2013-0016875 A | 2/2013 |
| KR | 10-2018-0074300 A | 7/2018 |

*Primary Examiner* — Yusef A Ahmed
(74) *Attorney, Agent, or Firm* — Morgan, Lewis & Bockius LLP

(57) ABSTRACT

The present disclosure relates to a high electric power density bidirectional isolated low voltage DC-DC converter (LDC) assembly, in which a large-capacity bidirectional isolated LDC circuit is packaged in consideration of a flow of electric power so as to use components in common and minimize an internal dead space, and a cooling structure thereof. LDC assembly includes a power board subassembly (100) including the high voltage stage, a part of the buck circuit, and the boost circuit; a transformer subassembly (200) including a transformer of the buck circuit; an output power board subassembly (300) including a part of the buck circuit; and an EMC filter subassembly (400) including an EMC filter included in the low voltage stage.

10 Claims, 6 Drawing Sheets

(56) References Cited

U.S. PATENT DOCUMENTS

| | | | |
|---|---|---|---|
| 2005/0030774 A1* | 2/2005 | Vazquez Carazo | H01L 41/107 363/84 |
| 2006/0120001 A1* | 6/2006 | Weber | H02M 7/003 361/103 |
| 2008/0031014 A1* | 2/2008 | Young | H02M 3/33569 363/16 |
| 2008/0304292 A1* | 12/2008 | Zeng | H02M 3/285 363/21.12 |
| 2010/0054001 A1* | 3/2010 | Dyer | H02M 1/4225 363/21.17 |
| 2010/0133912 A1* | 6/2010 | King | H02M 3/1584 307/82 |
| 2010/0136379 A1* | 6/2010 | King | H01M 8/0494 429/432 |
| 2010/0164428 A1* | 7/2010 | Xu | F02C 7/268 318/767 |
| 2010/0182803 A1* | 7/2010 | Nan | H02M 3/33592 363/21.02 |
| 2010/0246215 A1* | 9/2010 | Mase | H02M 1/40 363/21.04 |
| 2011/0037319 A1* | 2/2011 | Matsui | H02M 3/33584 307/43 |
| 2012/0051097 A1* | 3/2012 | Zhang | H02M 3/158 363/21.07 |
| 2012/0166013 A1* | 6/2012 | Park | H02J 3/32 700/297 |
| 2012/0299378 A1* | 11/2012 | King | H02M 3/1584 307/18 |
| 2013/0039104 A1* | 2/2013 | Sharma | H02M 3/33584 363/123 |
| 2013/0187453 A1* | 7/2013 | Flett | F28F 3/00 307/23 |
| 2013/0193849 A1* | 8/2013 | Zimmermann | H05B 45/46 315/112 |
| 2013/0286698 A1* | 10/2013 | Lee | H02M 3/33507 363/71 |
| 2014/0085944 A1* | 3/2014 | Lee | H02J 3/383 363/37 |
| 2014/0133186 A1* | 5/2014 | Balakrishnan | H02M 3/00 363/17 |
| 2015/0372499 A1* | 12/2015 | Purcarea | H02M 7/217 307/104 |
| 2016/0016479 A1* | 1/2016 | Khaligh | H01F 38/08 363/17 |
| 2019/0097543 A1* | 3/2019 | Achtzehn | H02M 3/1582 |
| 2019/0148973 A1* | 5/2019 | Kim | H02M 3/33584 320/109 |
| 2019/0165439 A1* | 5/2019 | Hirose | H01M 10/48 |
| 2019/0214838 A1* | 7/2019 | Nemenman | H02J 7/022 |
| 2019/0348833 A1* | 11/2019 | Sun | B60L 53/22 |
| 2020/0258675 A1* | 8/2020 | Jimenez Pino | H01F 27/2876 |
| 2021/0028692 A1* | 1/2021 | Green | H02P 23/26 |
| 2021/0155100 A1* | 5/2021 | Khaligh | B60L 53/22 |
| 2021/0155104 A1* | 5/2021 | Skutt | B60L 53/50 |

\* cited by examiner

LARGE-CAPACITY BIDIRECTIONAL ISOLATED DC-DC CONVERTER ASSEMBLY AND COOLING STRUCTURE THEREOF

CROSS-REFERENCE TO RELATED APPLICATIONS

This application claims the benefit of Korean Patent Application No. 10-2020-0179563, filed on Dec. 21, 2020, in the Korean Intellectual Property Office, the disclosure of which is incorporated herein in its entirety by reference.

BACKGROUND

1. Field of the Invention

The present disclosure relates to a large-capacity bidirectional electrically-isolated low voltage DC-DC converter (LDC) in which bidirectional LDC circuits are packaged in consideration of a flow of electric power and cooling efficiency at the time of boosting and bucking, and a cooling structure applied thereto.

2. Description of the Related Art

A low voltage DC-DC converter (LDC), which is a direct current electric power supplier that is applied to eco-friendly vehicles (HEV, PHEV, EV, FCV, etc.) by replacing an alternator of an internal combustion engine, is an essential device that receives high voltage battery electric power (for example, 180V to 450V) from a vehicle and charges a low voltage battery (for example, 12V) or that supplies necessary electric power to an electronic device. The LDC is used to increase fuel efficiency and cope with increasing electric loads by reducing a burden on an engine.

Components of the LDC are mainly composed of a high voltage electric power conversion component, a low voltage electric power conversion component, and a magnetic component that performs the functions of electric power transfers and electrical insulation between high voltage stage and low voltage stage.

A conventional LDC has a unidirectional function of receiving electric power from a high voltage battery (HVB) mounted in a vehicle and outputting electric power at a level of low voltage (for example, 12V) through an internal electric power conversion process.

Vehicles' electric loads have been recently increasing in response to user demand (4 kW class), and there is a need for a bidirectional LDC capable of transferring electric power from an electric power source of the low voltage battery (for example, 12V) to the high voltage stage. That is, there is a demand for a bidirectional LDC capable of not only electric power transfer from the high voltage stage to the low voltage stage (buck mode), which is the unidirectional function of the conventional LDC, but also electric power transfer from the low voltage stage to the high voltage stage (boost mode).

When applying the bidirectional LDC to a vehicle, a method for mounting a boost type LDC and a buck type LDC on the vehicle separately from each other may be used; however, there is another general method having a stacked structure of using only a cooling passage in common. In this case, the vehicle requires a space for mounting two devices and various interface components. Even when the components are implemented as a single package, it is difficult to utilize an internal dead space.

SUMMARY

As described above, in response to an increase in an amount of vehicle electric load caused by a recent request of a user, it is required to increase a capacity of a conventional isolated unidirectional (buck type) low voltage DC-DC converter (LDC) and to further include a (boost type) LDC having a boost function of transmitting low voltage electric power (for example, 12V) to a high voltage stage. When an LDC having both the boosting function and the buck function is applied to a vehicle, a package technology with high electric power density is required in the same manner as an electronic device for an electrically powered vehicle.

It is an object of the present disclosure to provide a high electric power density bidirectional isolated LDC assembly, in which a large-capacity bidirectional isolated LDC circuit is packaged in consideration of a flow of electric power so as to use components in common and minimize an internal dead space.

It is another object of the present disclosure to provide a high electric power density bidirectional isolated LDC assembly with a cooling structure optimized for cooling efficiency applied to packaging of a large-capacity bidirectional isolated LDC circuit.

According to an aspect of the present disclosure, there is provided a bidirectional isolated LDC assembly packaged with a high voltage stage, a low voltage stage, and a bidirectional isolated LDC circuit including a buck circuit and a boost circuit connected in parallel between the high voltage stage and the low voltage stage. The LDC assembly may include a power board subassembly including the high voltage stage, a part of the buck circuit, and the boost circuit; a transformer subassembly including a transformer of the buck circuit; an output power board subassembly including a part of the buck circuit; and an EMC filter subassembly including an EMC filter included in the low voltage stage.

According to another aspect of the present disclosure, there is provided a cooling structure of the bidirectional isolated LDC assembly. The cooling structure may include a first cooling passage through which coolant flows to cool a BtB switch of the buck circuit of the output power board subassembly; a second cooling passage through which the coolant discharged from the first cooling passage flows to cool the transformer of the buck circuit of the transformer subassembly; a third cooling passage through which the coolant discharged from the second cooling passage flows to cool the buck circuit of the power board subassembly; a fourth cooling passage through which the coolant discharged from the third cooling passage flows to cool the boost circuit of the power board subassembly; and a fifth cooling passage through which the coolant discharged from the fourth cooling passage flows to cool a switching device of the buck circuit of the output power board subassembly.

Configurations and operations of the present invention will become more apparent through specific embodiments to be described later with reference to the drawings.

DETAILED DESCRIPTION

Advantages and features of the present disclosure and a method for achieving them will become apparent with reference to preferred embodiments described in detail with reference to the accompanying drawings. However, the present disclosure is not limited to the embodiments described below and may be implemented in various other forms. The embodiments are merely provided to completely disclose the present disclosure and to fully inform those skilled in the art to which the present disclosure belongs of the scope of the present disclosure, and the present disclosure is defined by appended claims. In addition, terms used in the specification are considered in a descriptive sense only and not for purposes of limitation.

The terminology used herein is used for the purpose of describing particular embodiments only and is not intended to be limiting. It must be noted that as used herein and in the appended claims, the singular forms "a," "an," and "the" include the plural references unless the context clearly dictates otherwise. The terms "comprises," "comprising," "includes," "including," "containing," "has," "having," or other variations thereof, are inclusive and therefore specify the presence of stated features, integers, steps, operations, elements, and/or components but do not preclude the presence or addition of one or more other features, integers, steps, operations, elements, components, and/or a combination thereof. Furthermore, terms such as "first," "second," and other numerical terms are used only to distinguish one element from another element. These terms are generally only used to distinguish one element from another.

Hereinafter, preferred embodiments of the present disclosure will be described in detail with reference to the accompanying drawings. In the description of embodiments of the present disclosure, detailed description of well-known related structures or functions will be omitted when it is deemed that such description will obscure the description of the present disclosure.

Figure 1:
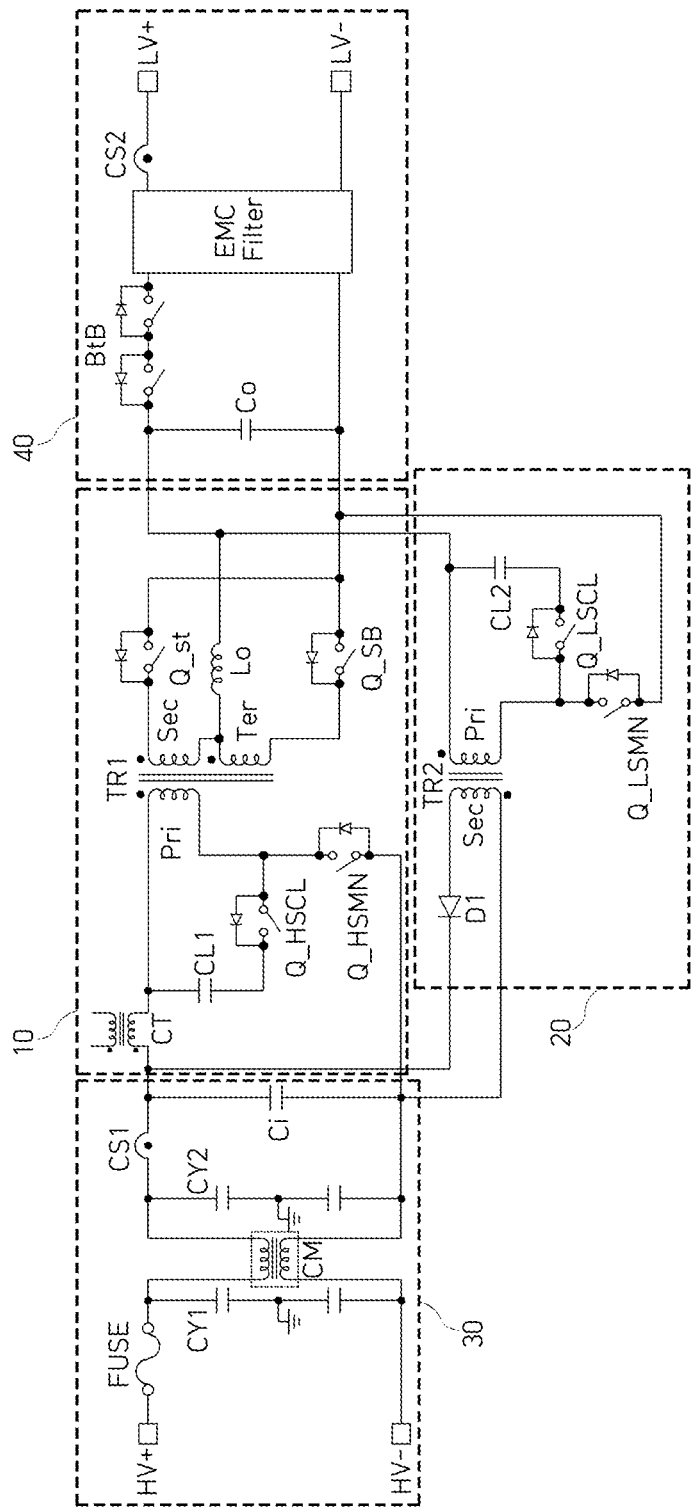
FIG. 1 is a circuit diagram of a large-capacity bidirectional isolated low voltage DC-DC converter (LDC) according to an embodiment of the present disclosure.

FIG. 1 is a circuit diagram of a large-capacity bidirectional electrically-isolated low voltage DC-DC converter (LDC) according to an embodiment of the present disclosure. In the circuit diagram of FIG. 1, a main functional unit may be divided into four blocks 10, 20, 30, and 40 (that is, a functional division).

First, a general circuit configuration will be described. A high voltage applied from a high voltage stage 30 including a high voltage battery HV for a vehicle may be bucked (stepped down) through a buck circuit 10 to be supplied to a low voltage battery LV (for example, 12V) of a low voltage stage 40 marked on a right side of the circuit diagram. Conversely, a low voltage applied from the battery LV of the low voltage stage 40 may be boosted (stepped up) through a boost circuit 20 to be supplied to the battery HV of the high voltage stage 30.

The LDC according to this embodiment may include the high voltage stage 30 and the low voltage stage 40 configured as a common circuit and two independent circuits provided in parallel between the high voltage stage 30 and the low voltage stage 40; that is, the buck circuit 10 and the boost circuit 20. The buck circuit 10 may be an active clamp forward converter circuit (hereinafter referred to as a forward converter circuit), and the boost circuit 20 may be an active clamp flyback converter circuit (hereinafter referred to as a flyback converter circuit).

First, main circuit components used in common are as follows.

A high voltage stage 30

HV: A high voltage battery for vehicle (for example, 180V to 450V)

CY1, CY2: A high voltage stage Y-CAP (capacitor connected between each electric power line and ground for noise filtering)

CM: A high voltage stage CM filter (inductor)

Ci: A high voltage stage DC filter (capacitor)

CS1: A high voltage stage current sensor (using a Hall sensor)

A low voltage stage 40

LV: A low voltage battery for a vehicle (for example, 12V)

Co: A low voltage stage DC filter (capacitor)

CS2: A low voltage stage current sensor (using a Hall sensor). CS2, with a high voltage stage current sensor CS1, may monitor a current in each of boost and buck modes, and may generate a fault signal when an overcurrent occurs, to determine an operation stop. CS2 may be also used to maintain a current of the low voltage stage to be in a constant level.

BtB: A bidirectional Back-to-Back switch for isolation of a low voltage stage

EMC FILTER: An EMC filter (an electromagnetic wave filter) of a low voltage stage through which a high current flows Next, main components of the buck circuit 10 and the boost circuit 20 are as follows.

A buck circuit 10

CT: A current sensor for sensing and converting a current into a voltage value for current control of a high voltage stage which is an input unit of the buck circuit 10. The CT may be implemented as a current transformer.

CL1: A capacitor for limiting a transformer voltage (clamp capacitor)

Q_HSMN, Q_HSCL: High voltage stage switching devices

TR1: An isolation transformer with one high voltage input (primary side) and two low voltage outputs (secondary and tertiary side)

Q_ST, Q_SB: High current type switching devices of a low voltage stage

Lo: An inductor for filtering an output current

A boost circuit (20)

CL2: A capacitor for limiting a transformer voltage (clamp capacitor)

Q_LSMN, Q_LSCL: Low voltage stage switching devices

TR2: An isolation transformer with one input (primary side) and one output (secondary side)

D1: A diode for rectifying an output power

As described above, the buck circuit 10 may be configured as a forward converter circuit. A forward converter using an HV as input and an LV as output may transfer electric energy of the HV to the LV while alternately switching the high voltage stage switching devices Q_HSCL and Q_HSMN. Since a voltage difference between the HV and the LV is very large, there is a limit in obtaining a desired output voltage by adjusting a duty (=a time period when a switch is turned on) in the same manner as a general DC-DC converter. A transformer TR1 may be an element required to overcome such a significant difference in input and output voltages and to electrically insulate. The transformer TR1 may determine a ratio of a primary winding to secondary and tertiary windings in consideration of an HV-LV voltage difference and a duty variable limit. When the switching devices Q_HSMN and Q_HSCL of the high voltage stage operate, second and third terminals of the transformer may output an AC square wave. The square wave may be rectified by low-voltage stage high-current switching devices Q_ST and Q_SB. The switching devices Q_ST and Q_SB may be used to reduce an efficiency reduction, even when an output current is high, by replacing the existing rectifier diodes used in the forward converter with semiconductor devices such as MOSFET. As a result, high efficiency, which is an important factor of eco-friendly vehicles, may be satisfied. The rectified output voltage, thereafter, may be maintained to be constant and stable by means of a filtering operation of an output inductor Lo and an output capacitor Co.

The boost circuit 20, as described above, may be configured as a flyback converter circuit. A flyback converter using the LV as input and the HV as output may transfer electric energy of the LV to the HV while alternately switching the low-voltage stage switching devices Q_LSCL and Q_LSMN. Since a voltage difference between the LV and the HV is very large, a transformer TR2 may be required in the same manner as the buck circuit, and a winding ratio of the transformer TR2 may need to be designed in advance. When switching devices Q_LSCL and Q_LSMN of the low voltage stage operate, a secondary winding of the transformer TR2 may output an AC square wave. The square wave may be rectified by a diode D1, which is a rectifying device connected between the transformer TR2 and the high voltage stage. Thereafter, an output capacitor Ci may maintain the output voltage to be constant and stable by filtering the output voltage.

Figure 2:
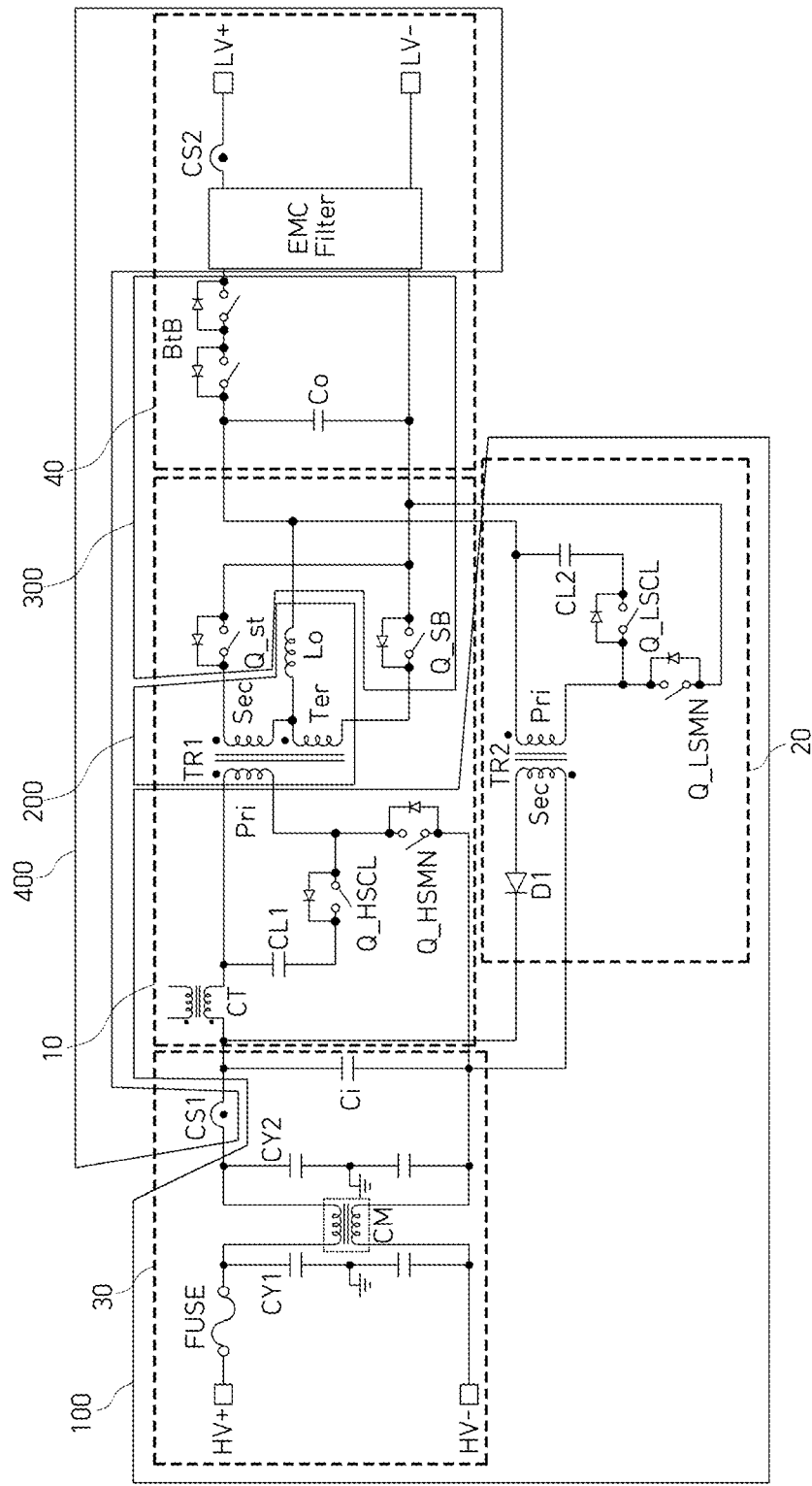
FIG. 2 is a block diagram of subassemblies of the LDC circuit of FIG. 1.

FIG. 2 illustrates components physically divided in the circuit of FIG. 1 so as to arrange the components in consideration of a flow of electric power and cooling efficiency at the time of boosting and bucking for a configuration of a package (assembly) of the large-capacity bidirectional isolated LDC circuit of FIG. 1. In addition, FIG. 3 illustrates an LDC assembly obtained by assembling and packaging respective physically divided subassemblies as illustrated in FIG. 2.

Each of the physically divided subassemblies may include: a power board subassembly 100 including the high voltage stage 30, a part of the buck circuit 10 (a current sensor CT on a primary side of the transformer TR1, a clamp capacitor CL1, and high voltage stage switching devices Q_HSMN and Q_HSCL), and the boost circuit 20; a transformer subassembly 200 including the transformer TR1 and the inductor Lo of the buck circuit 10; an output power board subassembly 300 including the high current switching devices Q_ST and Q_SB of an output unit (low voltage stage) located on a secondary side of the transformer TR1 of the buck circuit 10, and a DC filter capacitor Co and a BtB switch of the low voltage stage; and an EMC filter subassembly 400 including an EMC filter that performs a function of noise filtering of the output unit (low voltage stage) in a buck mode and a function of blocking switching noise of the low voltage stage which is an input unit in a boost mode.

Here, the current sensors (including high voltage stage current sensor CS1 and low voltage stage current sensor CS2), which are sensors that monitor a current in each of the boost and buck modes and generate a fault signal when an overcurrent occurs to determine an operation stop, may be included in the EMC filter subassembly 400, and alternatively a current sensor subassembly 500 may be configured as a separate unit.

Figure 3:
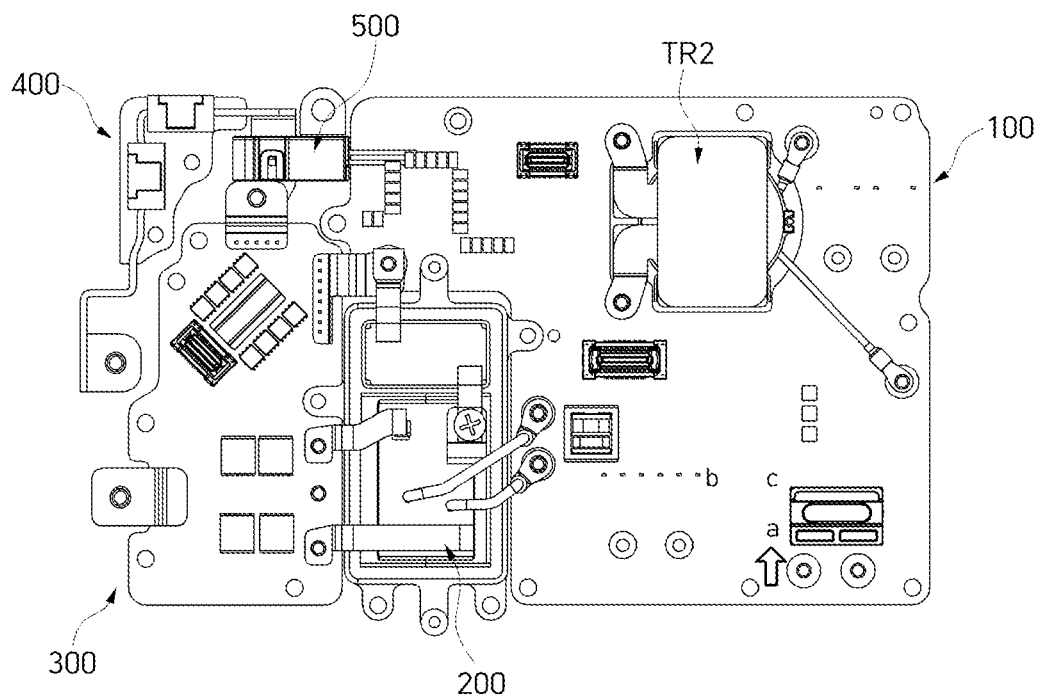
FIG. 3 illustrates an LDC assembly in which subassemblies are assembled and packaged.

By assembling respective subassemblies, one large-capacity bidirectional isolated LDC assembly may be configured as illustrated in FIG. 3. Referring to FIG. 3, the subassemblies 100, 200, 300, and 400, or 500 assembled in the form of a board or a single unit may be connected by using a certain means (e.g., a screw, a rivet, a busbar, or the like), and wire soldering may be performed on the subassemblies 100, 200, 300, and 400, or 500 to manufacture the LDC assembly. As a result, it is possible to obtain the efficient flow of electric power and excellent cooling performance at the time of LDC boosting and bucking.

Figure 4:
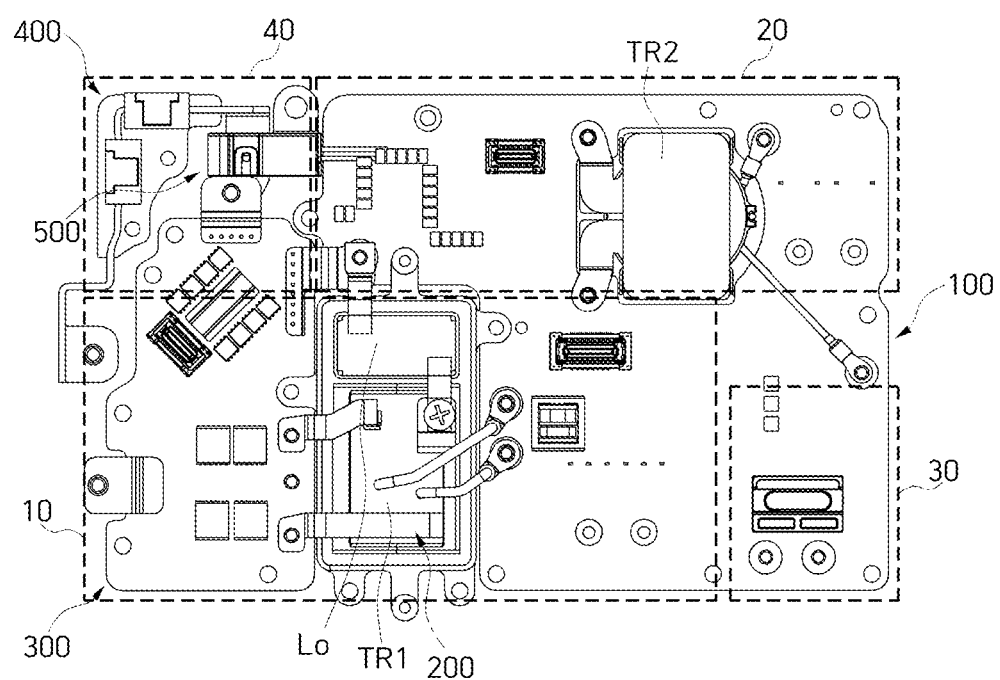
FIG. 4 illustrates locations of a buck circuit (10), a boost circuit (20), a high voltage stage (30), and a low voltage stage (40) in the assembly of FIG. 3.

FIG. 4 illustrates locations, in the assembly of FIG. 3, of the buck circuit 10, the boost circuit 20, the high voltage stage 30, and the low voltage stage 40, which are functional blocks illustrated in FIG. 1.

The buck circuit 10 may be divided into the power board subassembly 100, the transformer subassembly 200, and the output power board subassembly 300. Specifically, a switching unit and boost circuit of the primary side of the transformer TR1 of the buck circuit 10 may be provided in the power board subassembly 100, and the transformer TR1 and the inductor Lo may be provided in the transformer subassembly 200, and an output switching unit of the secondary side of the transformer TR1 may be provided in the output power board subassembly 300.

The boost circuit 20 may be provided in the power board subassembly 100 (upper portion of FIG. 4).

The high voltage stage 30 may be entirely provided in the power board subassembly 100 (bottom right of FIG. 4). In this way, a single high voltage stage 30 circuit is constructed in a boost/buck (bidirectional) LDC to pursue common use. That is, one power board subassembly 100 can be used in common with LDC modules of various specs (the same applies to other subassemblies).

The DC filter capacitor Co and the BtB switch of the low voltage stage 40 may be provided in the output power board subassembly 300, and the EMC filter may be provided in the EMC filter subassembly 400 (together with related components). In addition, the current sensors CS1 and CS2 may be provided in the current sensor subassembly 500 (together with related components).

Figure 5:
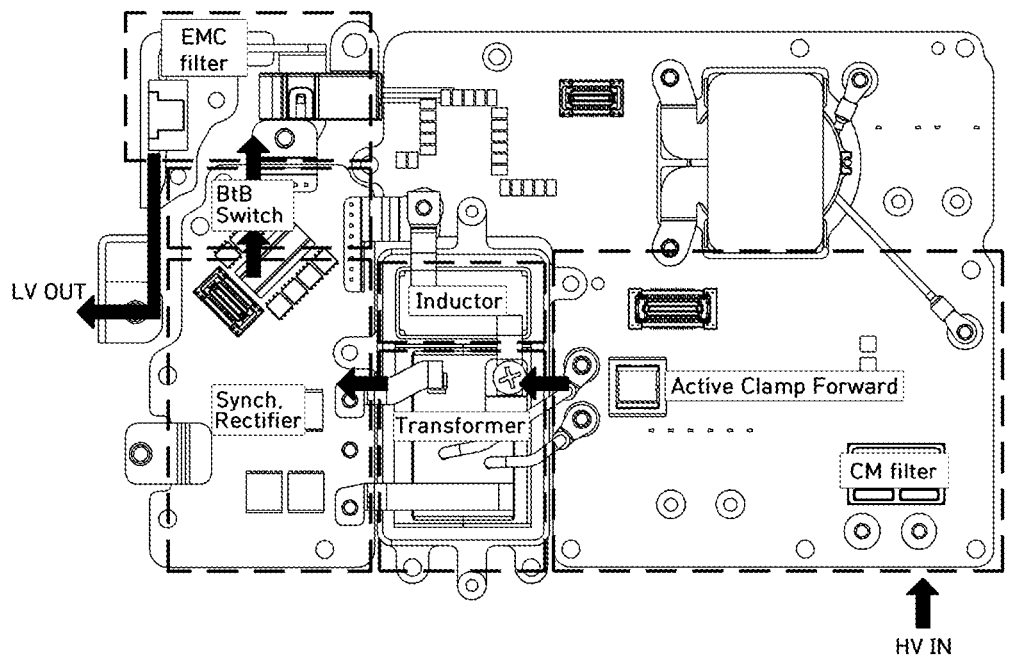
FIG. 5 illustrates a flow of electric power in a buck mode of an LDC assembly according to the present disclosure.

FIG. 5 illustrates a flow of electric power in the buck mode of the LDC assembly according to the present disclosure. Voltage of the high voltage battery HV may be applied to the CM filter of the high voltage stage of the power board subassembly 100 (here, filters such as the CM filter, DC filter, and Y-CAP of the high voltage stage may play a role of blocking noise introduced into or discharged from the high voltage stage) and may be rectified by the transformer and the inductor of the transformer subassembly 200 and a synchronous rectifier circuit (secondary side of the buck circuit) of the output power board subassembly 300 in a direction of an arrow through the active clamp forward converter (primary side of the buck circuit) to be converted into a low voltage. The converted low voltage may be outputted as a low voltage (LV OUT) through the BtB switch and the EMC filter subassembly 400.

Figure 6:
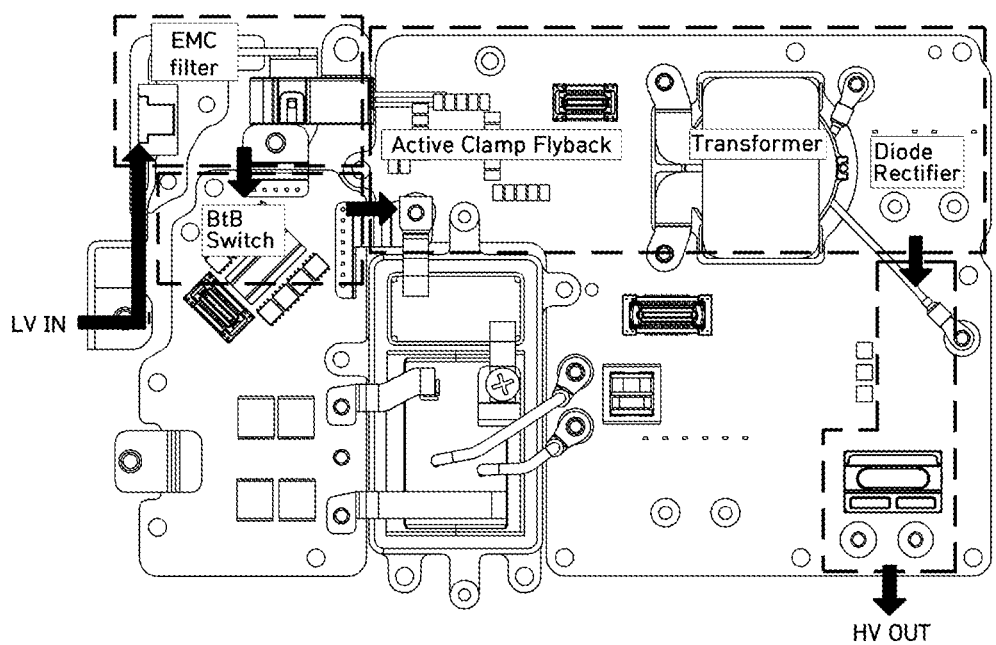
FIG. 6 illustrates a flow of electric power in a boost mode of an LDC assembly according to the present disclosure.

FIG. 6 illustrates a flow of electric power in the boost mode of the LDC assembly according to the present disclosure. Voltage of the low voltage battery LV may be input to the EMC filter subassembly 400 to be filtered so that the switching noise of the low voltage stage does not leak. Thereafter, the filtered voltage may be converted by passing through a switching device, a transformer, and a rectifier diode of the boost circuit 100 (active clamp flyback converter) through the BtB switch of the output power board subassembly 300, and the converted voltage may be output as a high voltage HV OUT through the high voltage stage of the power board subassembly 100.

Figure 7:
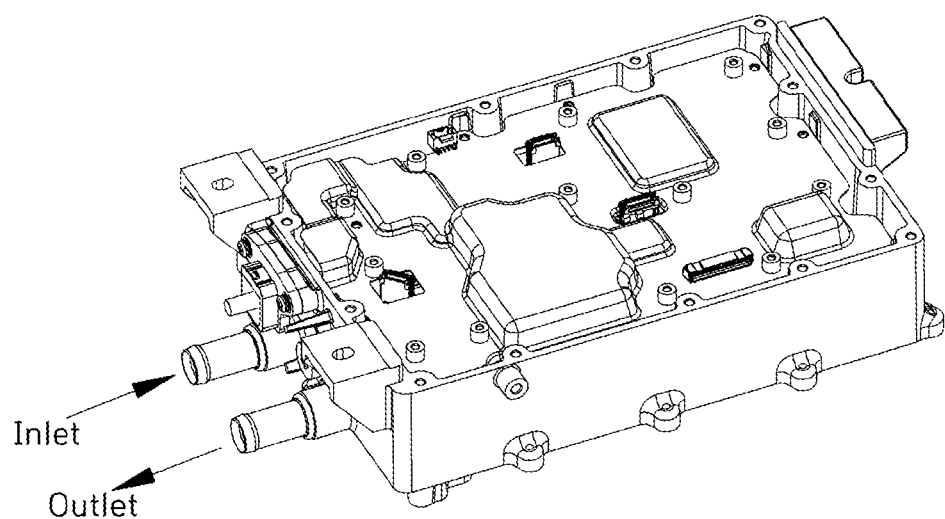
FIG. 7 is an external view of an LDC module manufactured by embedding an LDC assembly into a housing.

FIG. 7 illustrates an exterior of an LDC module manufactured by embedding the above-described LDC assembly in a housing. The LDC module may include multiple heat-generating components; coolant (cooling water, refrigerant, etc.) may be injected into an inlet installed in the housing to allow the coolant to flow through a cooling passage provided in a predetermined path in the housing so as to cool the LDC assembly and discharge the coolant through an outlet. In the foregoing, it has been described that a motive of the configuration of the package (assembly) of the large-capacity bidirectional isolated LDC circuit according to the present disclosure is to consider cooling efficiency as well as an efficient flow of electric power at the time of LDC boosting and bucking.

Figure 8:
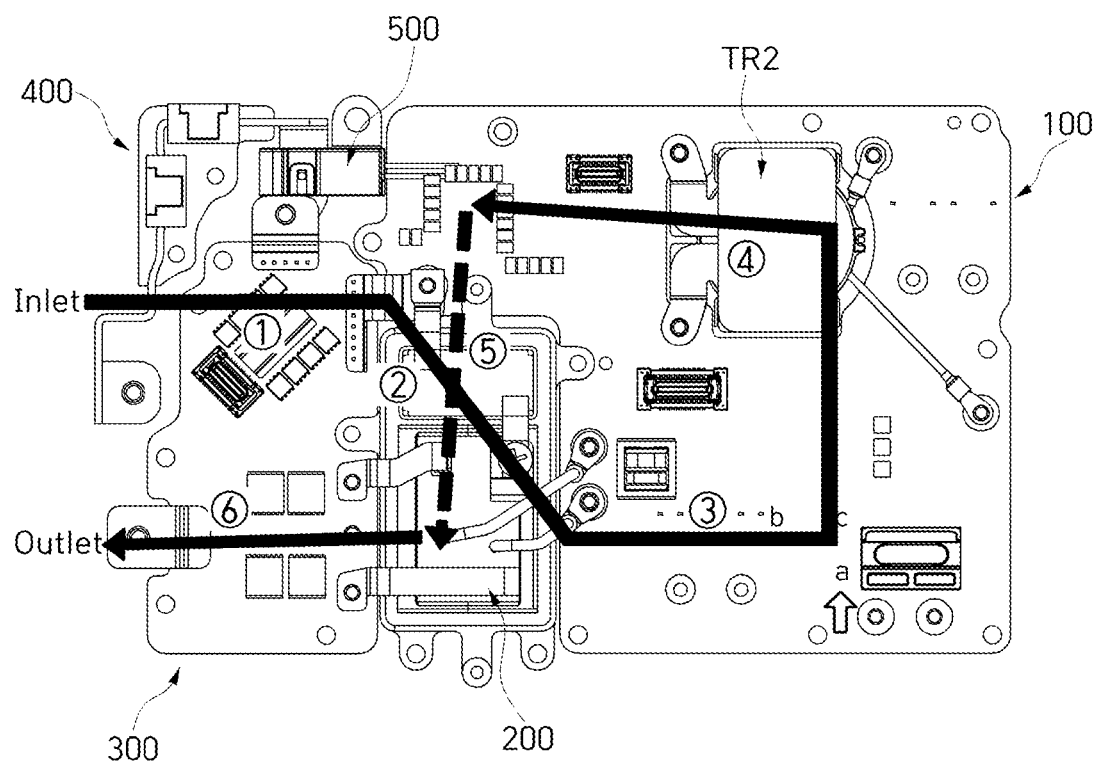
FIG. 8 illustrates a cooling passage for explaining a cooling structure of an LDC module.
Figure 9:
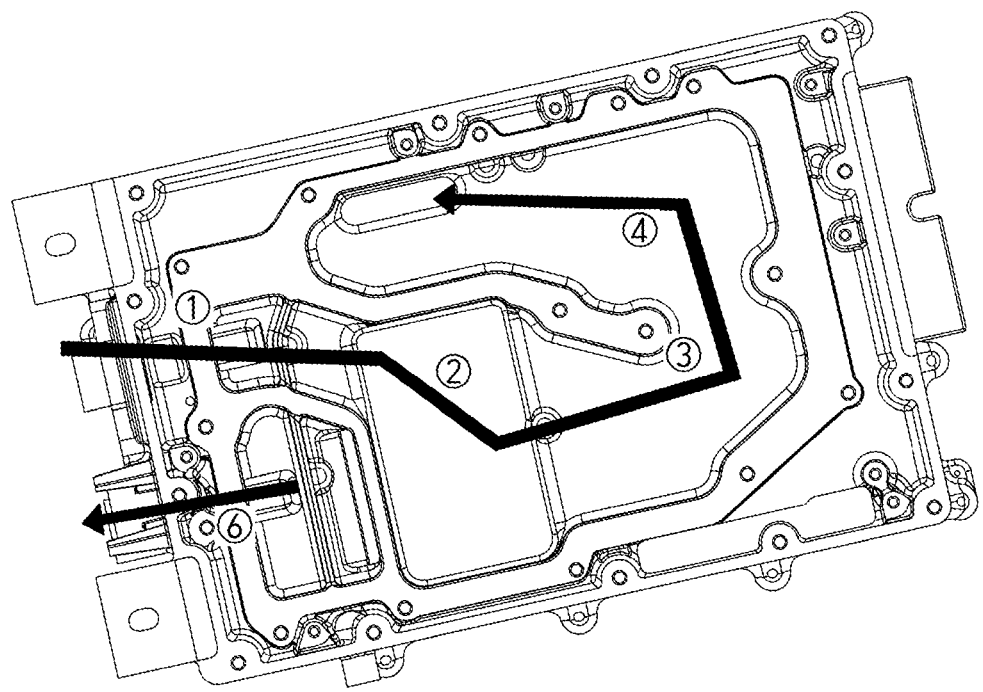
FIG. 9 illustrates a cooling passage of an upper surface of an LDC module.
Figure 10:
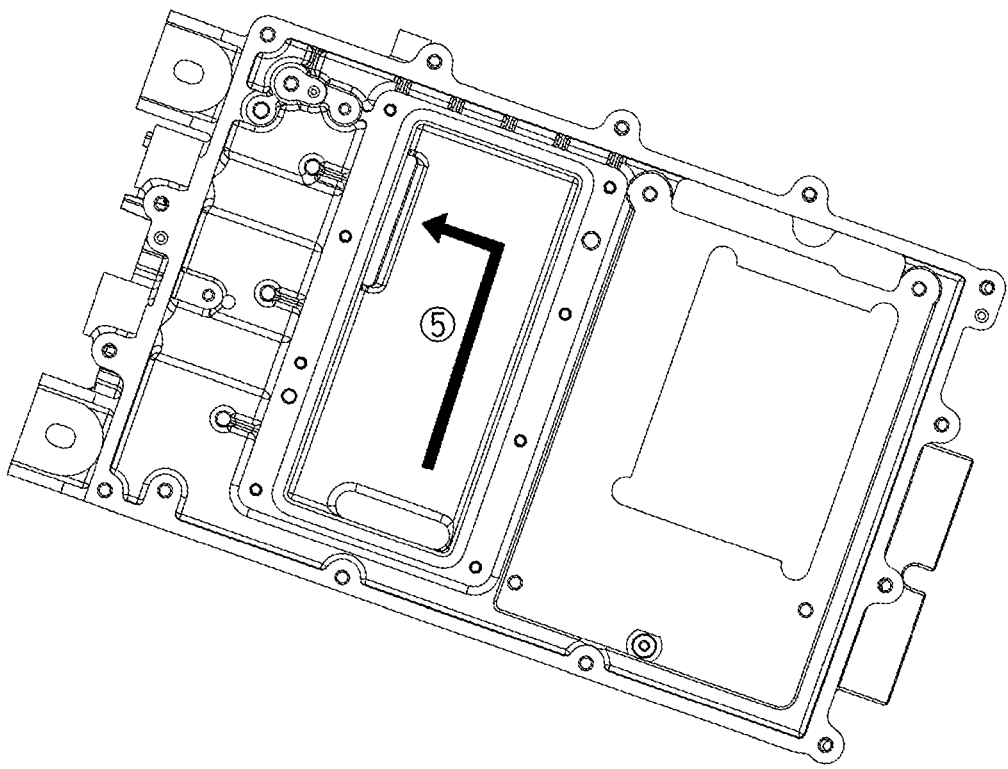
FIG. 10 illustrates a cooling passage of a lower surface of an LDC module.

FIG. 8 illustrates a cooling structure of an LDC module manufactured by embedding an LDC assembly according to the present disclosure in a housing. FIG. 9 illustrates a bottom surface of the LDC module, and FIG. 10 illustrates a top surface of the LDC module.

A cooling passage may be designed as illustrated in FIG. 8 for cooling the LDC module of the present disclosure. ① Coolant introduced through an inlet may flow through the cooling passage to cool a BtB switch (a bidirectional Back to Back switch for separation of a low voltage stage), which is a heat-generating component of the output power board subassembly 300. ② Thereafter, the coolant may cool a transformer (and inverter) through the cooling passage passing through the transformer subassembly 200 (see FIG. 10), ③ then may cool a buck circuit (illustrated at lower part) and ④ a boost circuit (illustrated at upper part) of the power board subassembly 100 sequentially, then ⑤ may cool a low voltage stage high current type switching device of the buck circuit in the output power board subassembly 300 through the cooling passage located at a bottom surface of the LDC module housing, and then ⑥ may be discharged through an outlet. Through such a cooling passage configuration, it is possible to sequentially cool the circuit components of the boost/buck type bidirectional LDC, thereby obtaining an excellent cooling effect.

According to the present disclosure, it is possible to obtain an effect of reducing the number of types of components and material costs by using components in common and minimizing a size. Specifically, a high voltage stage, a low voltage stage, a cooling passage, a housing, and a control circuit may be used in common, and thus a space that the product is to be mounted (mainly, an engine room) in a vehicle may be secured, and a weight of a product may be reduced. In addition, wires (for high voltage, low voltage, and signals) for connecting the vehicle and the product to each other may be reduced, and control variables also may be reduced, and thus many advantages in a view of the vehicle can be obtained. In addition, it is possible to reduce cost and space by using filters of high and low voltage stages, a PCB, and the like in common.

The above descriptions are merely illustrative of technical ideas of embodiments of the present disclosure, and it should be apparent to those skilled in the art to which embodiments of the present disclosure belong that various modifications, combinations, and alternations can be made without departing from the spirit and scope of embodiments of the present disclosure. Therefore, embodiments of the present disclosure are to be considered in a descriptive sense only and not for purposes of limitation. The present disclosure is thus not limited to the embodiments described above and rather intended to include the following appended claims and all modifications, equivalents, and alternatives falling within the spirit and scope of the following claims.

What is claimed is:

1. A bidirectional isolated low voltage DC-DC converter (LDC) assembly, the LDC assembly being packaged with a high voltage stage, a low voltage stage, and a bidirectional isolated DC-DC converter comprising a buck circuit and a boost circuit connected in parallel between the high voltage stage and the low voltage stage, the LDC assembly comprising:
   a power board subassembly comprising the high voltage stage, a part of the buck circuit, and the boost circuit;
   a transformer subassembly comprising a transformer of the buck circuit;
   an output power board subassembly comprising a part of the buck circuit;
   an EMC filter subassembly comprising an electromagnetic compatibility (EMC) filter comprised in the low voltage stage; and
   a current sensor subassembly comprising a low voltage stage current sensor,
   wherein the part of the buck circuit comprised in the power board subassembly comprises a high voltage stage switching device, a current transformer, and a clamp capacitor located on the primary side of the transformer of the buck circuit.

2. The bidirectional isolated LDC assembly of claim 1, wherein the transformer subassembly further comprises an inductor of the buck circuit.

3. The bidirectional isolated LDC assembly of claim 1, wherein the part of the buck circuit comprised in the output power board subassembly comprises a switching device and a back-to-back (BtB) switch located on a secondary side of the transformer.

4. The bidirectional isolated LDC assembly of claim 1, wherein the current sensor subassembly further comprises a high voltage stage current sensor.

5. The bidirectional isolated LDC assembly of claim 1, wherein the EMC filter subassembly comprises a high voltage stage current sensor and the low voltage stage current sensor.

6. The bidirectional isolated LDC assembly of claim 1, wherein
   the buck circuit is an active clamp forward converter circuit, and
   the boost circuit is an active clamp flyback converter circuit.

7. A cooling structure for cooling the bidirectional isolated low voltage DC-DC converter (LDC) assembly of claim 1, comprising:
   a first cooling passage through which coolant flows to cool a back-to-back (BtB) switch of the buck circuit of the output power board subassembly;
   a second cooling passage through which the coolant discharged from the first cooling passage flows to cool the transformer of the buck circuit of the transformer subassembly;
   a third cooling passage through which the coolant discharged from the second cooling passage flows to cool the buck circuit of the power board subassembly;
   a fourth cooling passage through which the coolant discharged from the third cooling passage flows to cool the boost circuit of the power board subassembly; and a fifth cooling passage flowing through which the coolant discharged from the fourth cooling passage flows to cool a switching device of the buck circuit of the output power board subassembly.

8. The bidirectional isolated LDC assembly cooling structure of claim 7, wherein the coolant flowing through the second cooling passage further cools an inductor of the buck circuit.

9. The bidirectional isolated LDC assembly cooling structure of claim 7, wherein the fifth cooling passage passes through a bottom surface of the output power board subassembly.

10. The bidirectional isolated LDC assembly cooling structure of claim 7, further comprising:
- an inlet through which the coolant is introduced into the first cooling passage; and
- an outlet through which the coolant is discharged from the fifth cooling passage.

* * * * *